(12) United States Patent
Fujiwara et al.

(10) Patent No.: US 8,759,852 B2
(45) Date of Patent: Jun. 24, 2014

(54) SEMICONDUCTOR DEVICE HAVING STACKED BODY ON SUBSTRATE VIA JOINING METAL AND METHOD FOR MANUFACTURING THE SAME

(75) Inventors: Akihiro Fujiwara, Fukuoka-ken (JP); Takashi Hakuno, Fukuoka-ken (JP); Tokuhiko Matsunaga, Fukuoka-ken (JP); Kimitaka Yoshimura, Fukuoka-ken (JP); Katsufumi Kondo, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 215 days.

(21) Appl. No.: 13/039,583

(22) Filed: Mar. 3, 2011

(65) Prior Publication Data

US 2012/0018752 A1    Jan. 26, 2012

(51) Int. Cl.
*H01L 29/22* (2006.01)
*H01L 29/24* (2006.01)

(52) U.S. Cl.
USPC .............................. 257/94; 257/98; 257/103

(58) Field of Classification Search
USPC ............. 257/81, 84, 94, 95, 98, 99, 102, 103, 257/E33.025, E33.027
See application file for complete search history.

(56) References Cited

U.S. PATENT DOCUMENTS

2010/0078659 A1*   4/2010   Iizuka et al. .................... 257/94

FOREIGN PATENT DOCUMENTS

| JP | 2009-123754 A | 11/2007 |
| JP | 2010-028140 | 2/2010 |

OTHER PUBLICATIONS

Japanese Office Action issued on May 24, 2013 in the counterpart Japanese patent application No. 2010-165583, an English translation thereof.

* cited by examiner

*Primary Examiner* — Hung Vu
(74) *Attorney, Agent, or Firm* — White & Case LLP

(57) ABSTRACT

According to one embodiment, a semiconductor device includes a substrate and a stacked body on the substrate via a joining metal layer. The stacked body includes a device portion and a peripheral portion. The device portion includes from a bottommost layer to a topmost layer included in the stacked body. The peripheral portion surrounding and provided around the device portion; the peripheral portion is a portion of the bottommost layer to the topmost layer included in the stacked body and includes a portion of a semiconductor layer in contact with the joining metal layer.

13 Claims, 7 Drawing Sheets

SEMICONDUCTOR DEVICE HAVING STACKED BODY ON SUBSTRATE VIA JOINING METAL AND METHOD FOR MANUFACTURING THE SAME

CROSS-REFERENCE TO RELATED APPLICATIONS

This application is based upon and claims the benefit of priority from the prior Japanese Patent Application No. 2010-165583, filed on Jul. 23, 2010; the entire contents of which are incorporated herein by reference.

FIELD

Embodiments of the invention relate generally to a semiconductor device and method for manufacturing the same.

BACKGROUND

Many semiconductor devices are fabricated using semiconductor layers that are epitaxially grown on a substrate. Compared to bulk crystals of semiconductors, semiconductor layers that are epitaxially grown have fewer defects, are of higher quality, and therefore can improve the characteristics of the semiconductor devices.

However, substrates that are used for the epitaxial growth principally perform a role of mechanically supporting thin film semiconductor layers and rarely proactively function to improve the characteristics of semiconductor devices. In some cases, such substrates are a factor that inhibits the realization of high performance in semiconductor devices. For example, in light emitting devices formed by using InGaAlP semiconductors that emit light in the green to red wavelength range, GaAs substrates that have similar lattice constants are used as growth substrates. However, there is a problem in that GaAs crystals absorb green to red light, thus causing luminous intensity to decrease.

Hence, a technique is used wherein a high-quality InGaAlP semiconductor is grown on the GaAs substrate, and thereafter a stacked body having a plurality of semiconductor layers including a light emitting layer is transferred to another substrate. For example, the stacked body can be adhered to a support substrate formed from silicon or the like via a joining metal layer that reflects light emitted from the light emitting layer. Thereby, the light absorption by the substrate can be eliminated and the luminous intensity of the light emitting device can be increased.

However, in a cutting process in which the support substrate provided with the joining metal layer is diced, curls and other defects are prone to be formed on an edge of the cut-out chip, which leads to a decline in production yield. Therefore, there is a need for a semiconductor device and method for manufacturing the same wherein the forming of curls and other defects can be suppressed when cutting the chips from a support substrate that has a joining metal layer provided on a surface thereof.

DETAILED DESCRIPTION

Figure 1A:
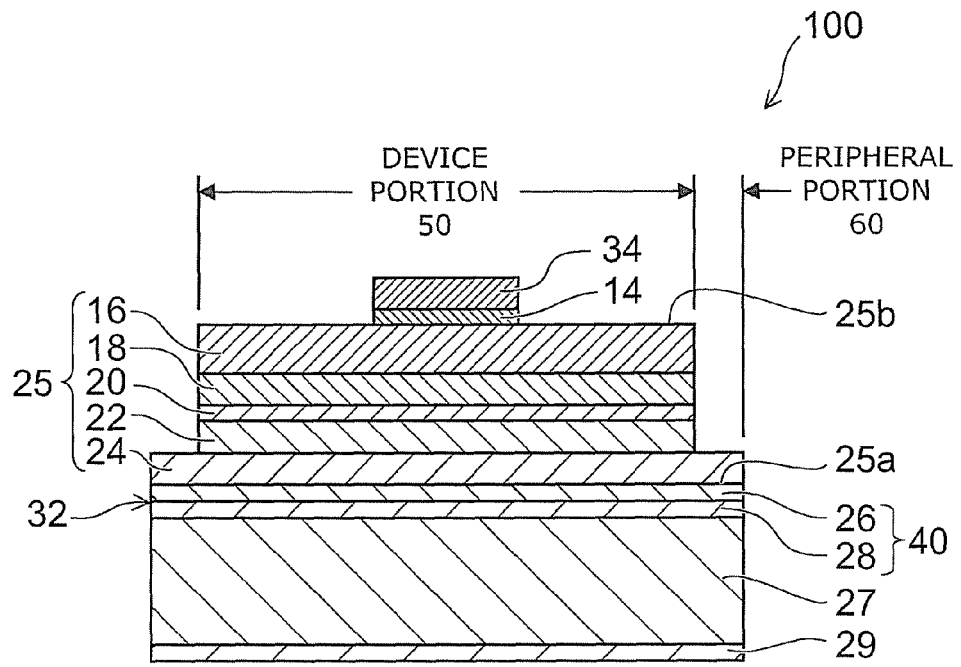
FIG. 1A is a schematic cross-sectional view illustrating a semiconductor device and FIG. 1B is a planar photograph showing a chip surface of the semiconductor device according to an embodiment.

In general, according to one embodiment, a semiconductor device includes a substrate and a stacked body on the substrate via a joining metal layer. The stacked body includes a device portion and a peripheral portion. The device portion includes from a bottommost layer to a topmost layer included in the stacked body. The peripheral portion surrounding and provided around the device portion; the peripheral portion is a portion of the bottommost layer to the topmost layer included in the stacked body and includes a portion of a semiconductor layer in contact with the joining metal layer.

Embodiments of the invention will now be described while referring to the drawings. Note that in the following embodiments, the same numerals are applied to constituents that have already appeared in the drawings and, and repetitious detailed descriptions of such constituents are appropriately omitted.

Figure 1B:
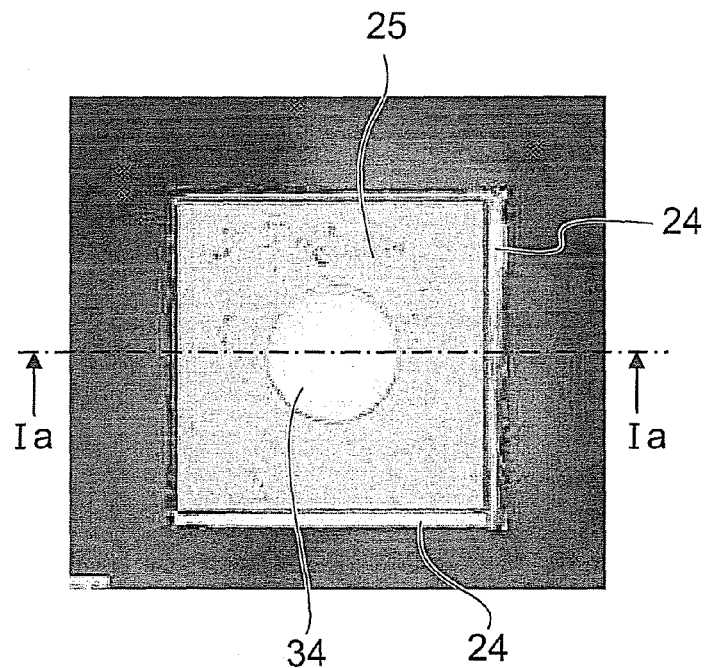

FIGS. 1A and 1B are schematic views illustrating a semiconductor device 100 according to an embodiment. FIG. 1A schematically illustrates a structure of a cross-section taken across the line 1a-1a illustrated in FIG. 1B. FIG. 1B is a planar photograph illustrating a chip surface of the semiconductor device 100.

The semiconductor device 100 is, for example, a light emitting diode and has a stacked body 25 adhered on a substrate (support substrate 27) via a joining metal layer 40.

As illustrated in FIG. 1A, the semiconductor device 100 includes a device portion 50 provided in the stacked body 25 and a peripheral portion 60 provided so as to surround the device portion 50.

The device portion 50 includes from a p-type contact layer 24 that is a bottommost layer to an n-type current diffusion layer 16 that is a topmost layer of the stacked body 25. Additionally, the device portion 50 includes a light emitting layer 20 that emits luminescent light. The joining metal layer 40 contains a metal that reflects the light that the light emitting layer 20 emits. The peripheral portion 60 is a portion of a plurality of layers included from the bottommost layer to the topmost layer of the stacked body 25, and includes at least a portion of the p-type contact layer 24 that is a semiconductor layer in contact with the joining metal layer 40

Hereinafter, the semiconductor device 100 is described in detail while referring to FIG. 1A.

In the semiconductor device 100, the stacked body 25 having the light emitting layer 20 and the support substrate 27 are joined via the joining metal layer 40. The joining metal layer 40 includes a first joining metal layer 26 provided on a first major surface 25a of the stacked body 25 and a second joining metal layer 28 provided on the support substrate 27. The first joining metal layer 26 and the second joining metal layer 28 are joined at a joint interface 32. The second joining metal layer 28 is connected to a p-side electrode 29 via the conductive support substrate 27.

A second major surface 25b of the stacked body 25 is, for example, connected to an n-side electrode 34 via an n-type contact layer 14. Current is fed into the light emitting layer 20 by the current flowing from the p-side electrode 29 to the n-side electrode 34, and luminescent light having a wavelength corresponding to a band gap energy of the light emitting layer 20 is emitted.

In FIG. 1A, the stacked body 25 has, from the n-side electrode 34, the n-type current diffusion layer 16, an n-type clad layer 18, the light emitting layer 20, a p-type clad layer 22, and the p-type contact layer 24. An InGaAlP semiconductor material can be used, for example, for the stacked body 25.

A silicon wafer can be used, for example, for the support substrate 27.

Note that "InGaAlP semiconductor" refers to a semiconductor expressed by the composition formula $In_x(Ga_yAl_{1-y})_{1-x}P$ (where $0 \leq x \leq 1$ and $0 \leq y \leq 1$), and includes semiconductors that have been doped with p-type impurities or n-type impurities. In this case, the wavelength of the luminescent light can be selected from a range of from green to red by changing the composition of the InGaAlP contained in the light emitting layer 20.

Furthermore, a nitride semiconductor expressed by the composition formula $B_xIn_yGa_zAl_{1-x-y-z}N$ (where $0 \leq x \leq 1$, $0 \leq y \leq 1$, $0 \leq z \leq 1$, and $x+y+z \leq 1$) can be used for the stacked body 25. In this case, the wavelength of the luminescent light can be selected from a range of from purple to green.

Next, a method for manufacturing the semiconductor device 100 will be described while referring to FIGS. 2 to 4.

Figure 2A:
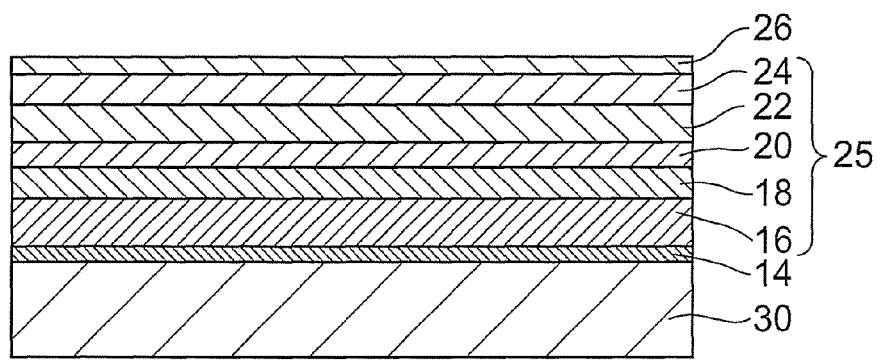
FIG. 2A to 4B are schematic cross-sectional views illustrating manufacturing processes of the semiconductor device according to the embodiment.

FIG. 2A is a schematic cross-sectional view illustrating a state in which the stacked body 25 and the first joining metal layer 26 have been formed on a GaAs substrate 30.

For example, a GaAs buffer layer (not shown) and an n-type GaAs contact layer 14 (impurity concentration: $1 \times 10^{18}$ cm$^{-3}$; thickness: 0.1 μm) are formed on the GaAs substrate 30.

Next, the current diffusion layer 16 (impurity concentration: $4 \times 10^{17}$ cm$^{-3}$; thickness: 2 μm) formed from n-type $In_{0.5}(Ga_{0.3}Al_{0.7})_{0.5}P$, the n-type clad layer 18 (impurity concentration: $4 \times 10^{17}$ cm$^{-3}$; thickness: 0.6 μm) formed from n-type InAlP, the light emitting layer 20, the p-type clad layer 22 (impurity concentration: $2 \times 10^{17}$ cm$^{-3}$; thickness: 0.6 μm) formed from InAlP, and the p-type contact layer 24 (impurity concentration: $9 \times 10^{18}$ cm$^{-3}$; thickness: 0.4 μm) formed from p-type $Ga_{0.5}Al_{0.5}As$ constituting the stacked body 25 are stacked subsequently.

These semiconductor layers can, for example, be epitaxially grown by using Metal Organic Chemical Vapor Deposition (MOCVD) or the like.

The light emitting layer 20 can include a p-type Multi Quantum Well (MQW) structure in which an impurity concentration is about $1 \times 10^{17}$ cm$^{-3}$. The MQW can be formed by alternately stacking $In_{0.5}(Ga_{0.94}Al_{0.6})_{0.5}P$ having a width of about 10 nm that is a well layer and $In_{0.5}(Ga_{0.94}Al_{0.6})_{0.5}P$ having a width of about 20 nm that is a barrier layer.

In this case, red light with a peak wavelength of roughly 624 nm and a dominant wavelength of roughly 615 nm can be obtained as the luminescent light.

Next, Au (thickness: 0.05 μm), AuZn (Zn content: 0.3%; thickness: 0.2 μm), and Au (thickness: 0.6 μm) are stacked subsequently on the p-type contact layer 24 to form the first joining metal layer 26.

Figure 2B:
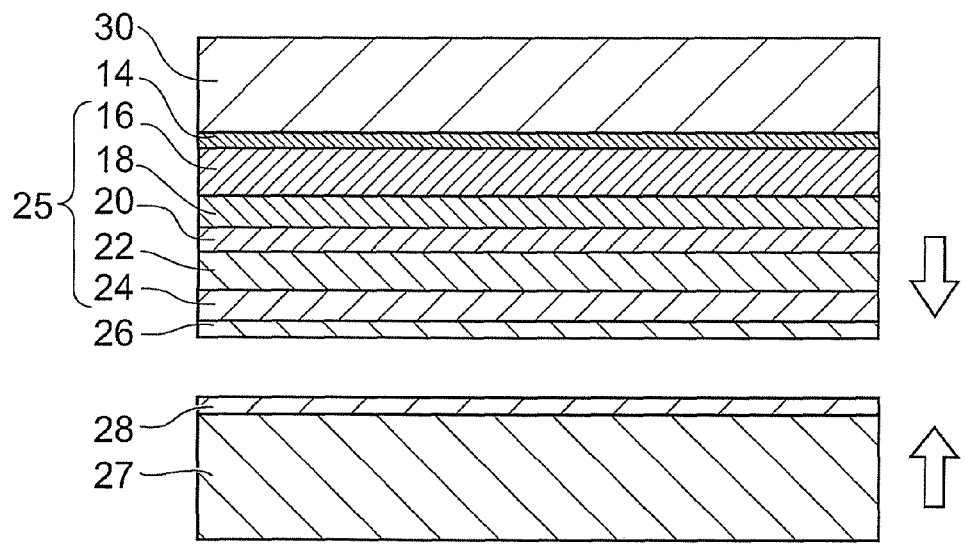

Next, as illustrated in FIG. 2B, the stacked body 25 is joined to the support substrate 27 (impurity concentration: $1 \times 10^{19}$ cm$^{-3}$; thickness: 200 μm) formed from a p-type silicon having, for example, a face orientation of (100), via the first joining metal layer 26 and the second joining metal layer 28.

The second joining metal layer 28 formed from Ti (thickness: 0.1 μm), Pt (thickness: 0.12 μm), and Au (thickness: 0.2 μm) is formed by a vacuum evaporation method or the like on a first face of the support substrate 27.

Thereafter, as illustrated in FIG. 2B, the first joining metal layer 26 and the second joining metal layer 28 are aligned, and the stacked body 25 and the support substrate 27 are joined, for example, by heating at about 300° C. while applying pressure in a vacuum.

Figure 3A:
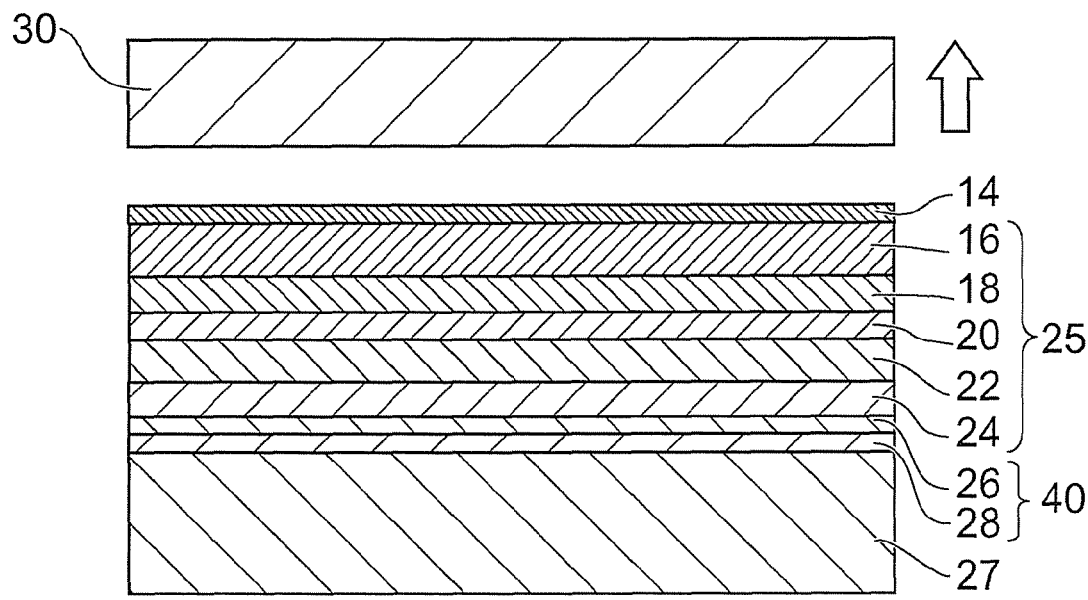

Next, as illustrated in FIG. 3A, the GaAs substrate 30 is removed, for example, by a wet etching process. Thereafter, for example, by sintering the support substrate 27 and the stacked body 25 at 400° C., adhesive strength of the interface 32 of the Au layers between the first joining metal layer 26 and the second joining metal layer 28 can be increased.

The joining metal layer 40 is formed by aligning the first joining metal layer 26 and the second joining metal layer 28 and contact bonding each Au layer thereof. The Au layer included in the joining metal layer 40 is a metal that reflects the light emitted from the light emitting layer 20 upwards, thereby increasing luminous intensity.

Figure 3B:
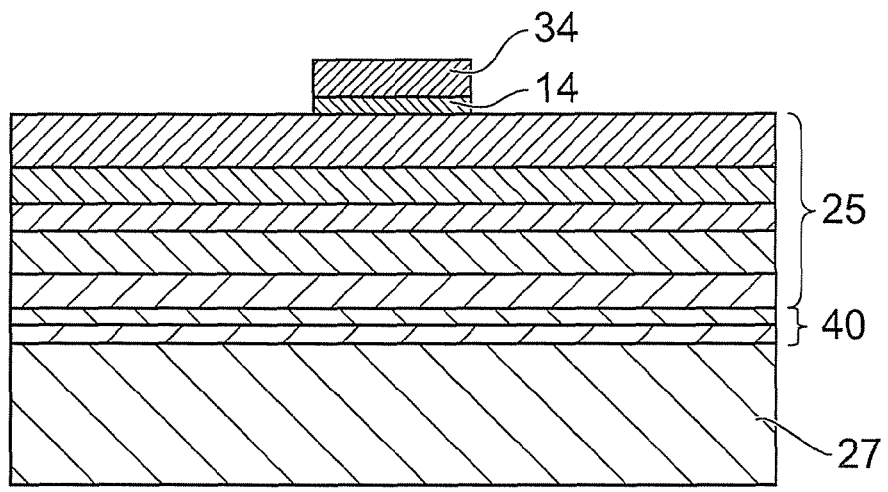

Thereafter, as illustrated in FIG. 3B, the n-side electrode 34 is formed.

The n-side electrode 34 is formed, for example, by using a lift-off process on a surface of the n-type contact layer 14 to subsequently stack AuGe (Ge content: about 3%; thickness: 50 nm), Au (thickness: 100 nm), Mo (thickness: 150 nm), Au (thickness: 150 nm), Mo (thickness: 50 nm) and Au (thickness: 600 nm).

Thereafter, for example, the n-type contact layer 14 is etched using the n-side electrode 34 as a mask.

Figure 4A:
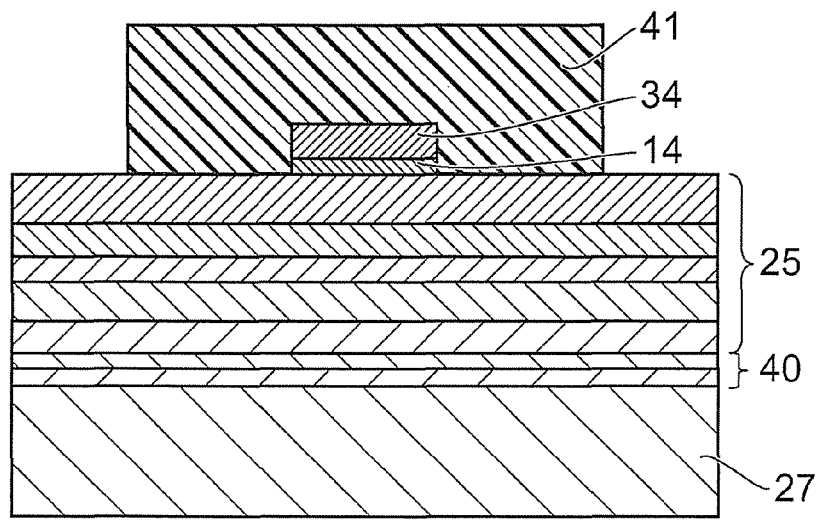

Next, as illustrated in FIG. 4A, a resist mask 41 for forming the peripheral portion 60 is formed on a portion of the surface of the stacked body 25 that will become the device portion 50.

Figure 4B:
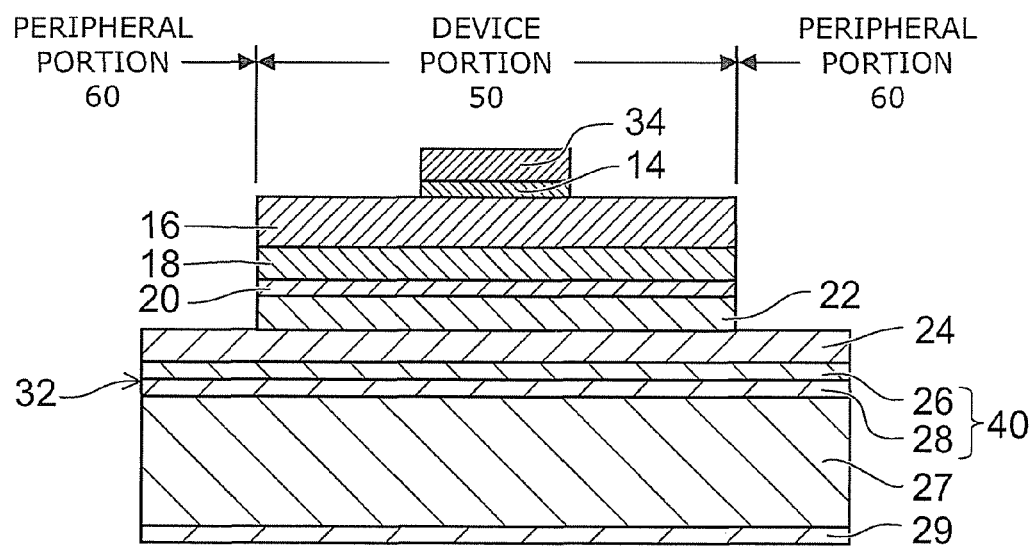

Thereafter, as illustrated in FIG. 4B, a wet etching process, for example, is used to etch a portion around the device portion 50 that will become the peripheral portion 60. Here, etching can be performed so that the p-type contact layer 24 in contact with the joining metal layer 40 remains.

Specifically, the n-type current diffusion layer 16, the n-type clad layer 18, the light emitting layer 20, and the p-type clad layer 22 are subsequently removed by etching. Here, an etching time is adjusted so that the p-type contact layer 24 will be left on the joining metal layer 40.

For example, etching is performed for from 10 to 60 minutes using a compound liquid of $HCl+H_2O_2+H_2O$ with a solution temperature adjusted to be in a range of from −30 to 30° C.

Furthermore, when etching the p-type clad layer 22 formed from InAlP, an etchant with a faster etching speed with respect to InAlP than to p-type $Ga_{0.5}Al_{0.5}As$ can be used. Thereby, leaving the p-type contact layer 24 formed from the p-type $Ga_{0.5}Al_{0.5}As$ on the joining metal layer 40 will be facilitated. A layer having a uniform thickness can be left as a protective layer by using selective etching or Reactive Ion Etching (RIE).

The p-type contact layer 24 left on the joining metal layer 40 may be etched, for example, to a thickness less than the initial thickness of 0.4 μm. Furthermore, the semiconductor layer left on the joining metal layer 40 is not limited to the p-type contact layer 24, and, for example, the p-type clad layer 22 may be left in addition to the p-type contact layer 24. By leaving a plurality of layers as desired in this way, the plurality of layers can be designed according to the dicing conditions and/or the joining metal layer to function as a protective layer.

Next, the p-side electrode 29 is formed on a reverse side of the support substrate 27 by subsequently stacking Ti (thickness: 0.1 µm), Pt (thickness: 0.12 µm), and Au (thickness: 0.2 µm).

Thereafter, individual chips including the device portion 50 are separated by cutting the peripheral portion 60 using, for example, a dicing saw.

Figure 5A:
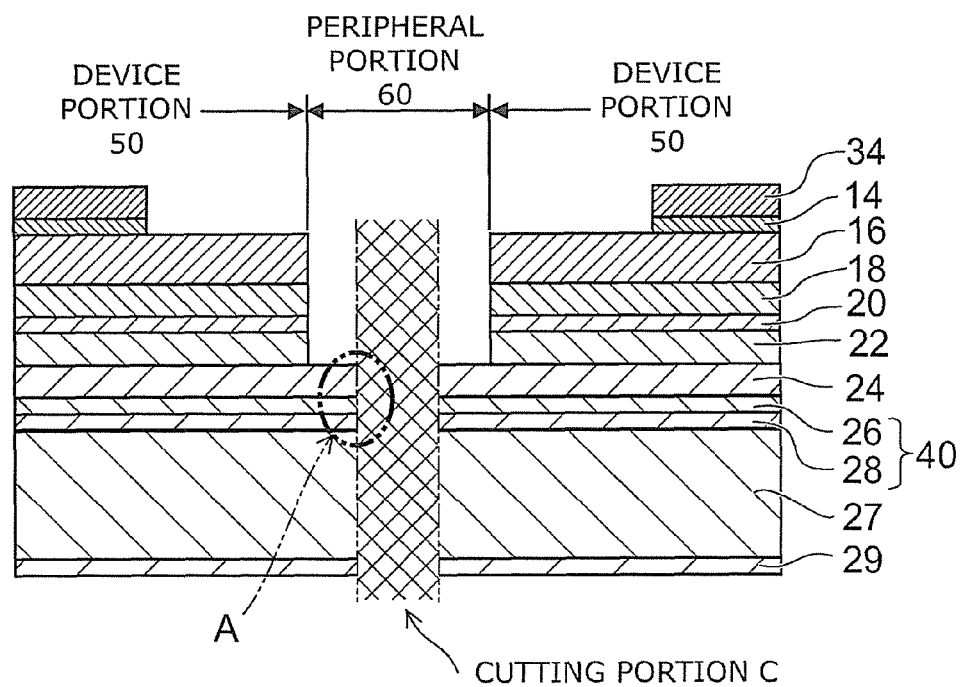
FIG. 5A is a schematic cross-sectional view centered on a peripheral portion of the semiconductor device.
Figure 5B:
FIG. 5B is an SEM image showing an edge A of the semiconductor device according to the embodiment.

FIGS. 5A and 5B are, respectively, a schematic view and an SEM image illustrating a cross-section of the semiconductor device 100. FIG. 5A is a schematic cross-sectional view centered on the peripheral portion 60. FIG. 5B is an SEM image showing an edge A of the semiconductor device 100 that is separated into individual chips.

As illustrated in FIG. 5A, a cutting portion C in a center of the peripheral portion 60 is cut by using, for example, a dicing saw.

The dicing parameters can be set to, for example, a dicing blade feed rate of from 5 to 20 mm/sec and to a revolution rate of from 25,000 to 50,000 RPM. A supply rate of coolant liquid to the dicing blade can be set to from 0.5 to 1.0 liters/min.

FIG. 5B is an SEM image of the edge A illustrated in FIG. 5A. Cut surfaces of the support substrate 27, the joining metal layer 40, and the p-type contact layer 24 left on the joining metal layer 40 are shown.

Figure 6A:
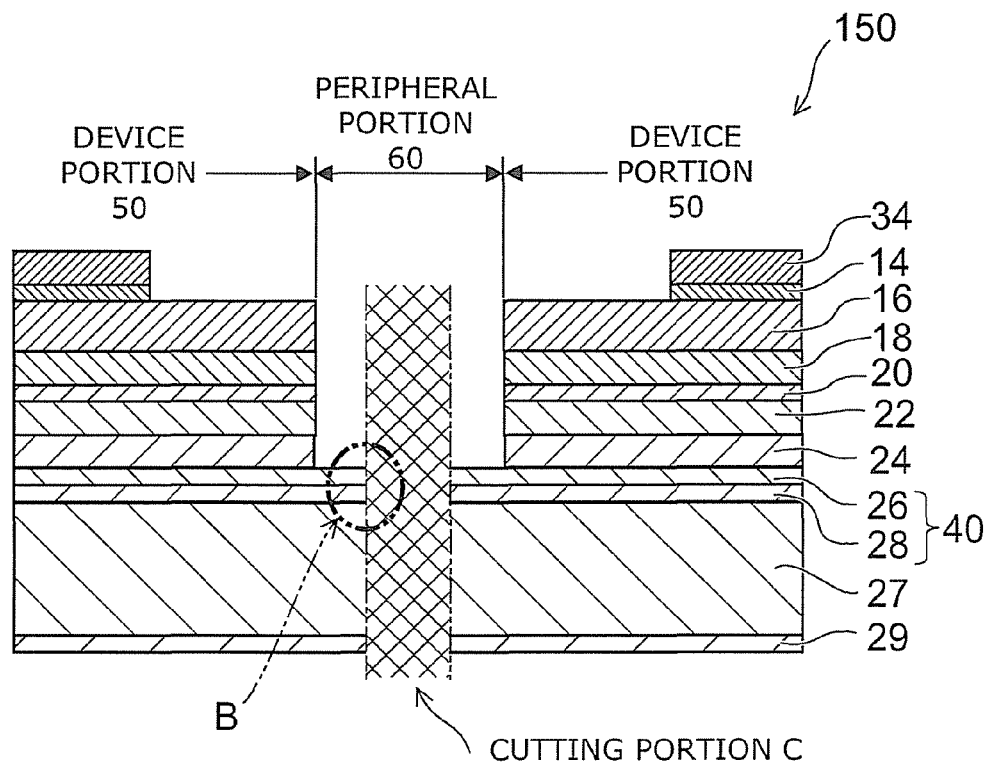
FIG. 6A is a schematic cross-sectional view centered on a peripheral portion of a semiconductor device.
Figure 6B:
FIG. 6B is an SEM image showing an edge B of the semiconductor device according to a comparative example.

On the other hand, FIGS. 6A and 6B are, respectively, a schematic view and an SEM image illustrating a cross-section of a semiconductor device 150 according to a comparative example. FIG. 6A is a schematic cross-sectional view centered on the peripheral portion 60. FIG. 6B is an SEM image showing an edge B of the semiconductor device 150 that is separated into individual chips.

As illustrated in FIG. 6A, in the semiconductor device 150, an entirety of the p-type contact layer 24 is removed in the peripheral portion 60 by etching and the surface of the joining metal layer 40 is exposed.

As shown in FIG. 6B, cracking has occurred in a surface of the support substrate 27 at the chip edge B of the semiconductor device 150 that has been cut using a dicing saw. Furthermore, it is clear that the joining metal layer 40 has curled and so-called Au curls have formed.

In contrast, in the chip edge A shown in FIG. 5B, it is clear that curls such as those seen in FIG. 6B are not present and that the chip has been cut into a satisfactory shape.

Specifically, by leaving a semiconductor layer (the p-type contact layer 24) on the joining metal layer 40, it is possible to suppress the formation of defects such as curls and the like when dicing processing, and thereby the quality of the chips can be improved. Furthermore, because the thickness of the protective layer formed from the semiconductor layer is uniform, shape reproducibility after dicing can be improved.

Figure 7A:
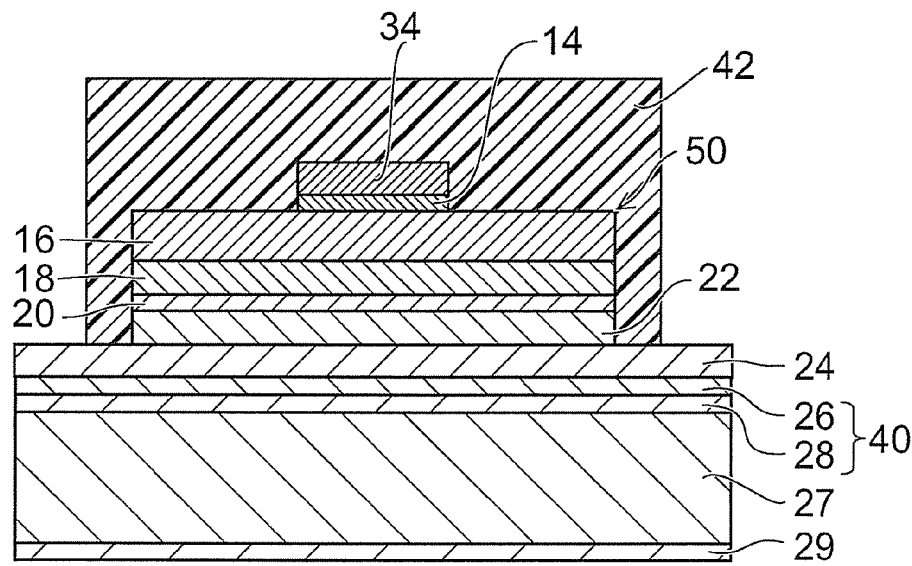
FIGS. 7A and 7B are schematic cross-sectional views illustrating a manufacturing process of a semiconductor device according to a variation of the embodiment.
Figure 7B:
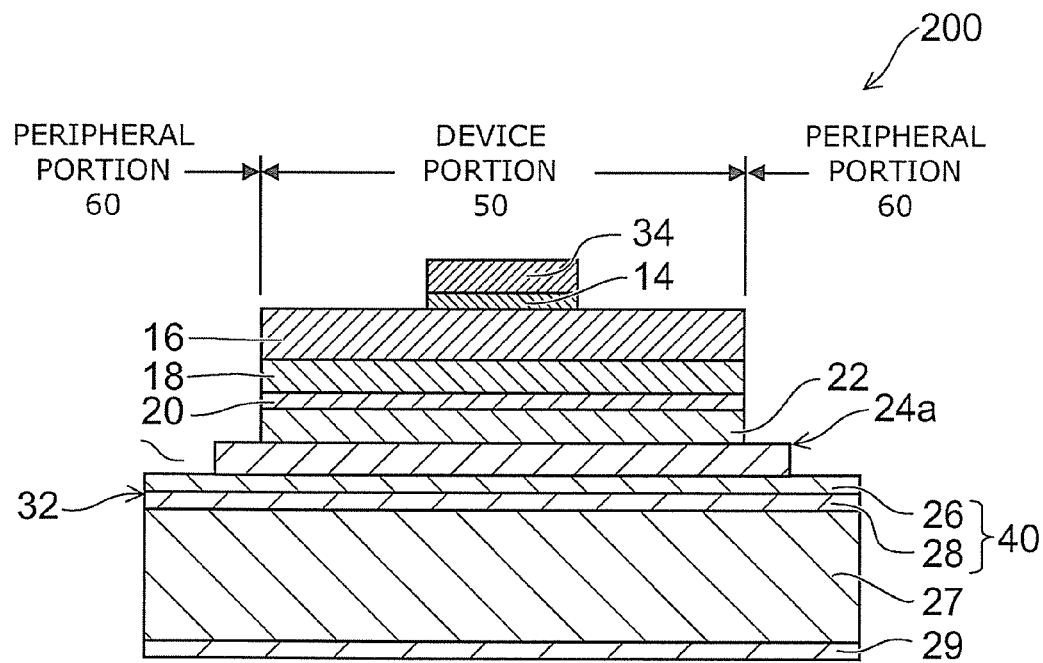

FIGS. 7A and 7B are schematic cross-sectional views illustrating a manufacturing process of a semiconductor device 200 according to a variation of this embodiment.

As illustrated in FIG. 7A, after forming the peripheral portion 60 while leaving the p-type contact layer 24 on the joining metal layer 40, a resist mask 42 covering the device portion 50 is formed.

Thereafter, individual chips including the device portion 50 are separated by cutting the peripheral portion 60 using, for example, a dicing saw.

Then, using the resist mask 42 as an etching mask, the p-type contact layer 24 that was left on the surface of the peripheral portion 60 is removed. A wet etching process can be used, for example, for the etching of the p-type contact layer 24.

Specifically, after the support substrate 27 is cut on a dicing sheet (not shown) and separated into individual chips, the p-type contact layer 24 of the chips adhered to the dicing sheet can be etched by immersing the dicing sheet in an etchant.

Thereby, as shown in FIG. 7B, the surface of the joining metal layer 40 can be exposed while leaving a p-type contact layer 24a on a portion of the peripheral portion 60.

On the other hand, because the device portion 50 is protected by the resist mask 42, the light emitting layer 20, the n-side electrode 34, and the like will not be eroded by the etchant, and therefore, the characteristics of the semiconductor device 200 will not deteriorate.

The resist mask 42 can be removed by, for example, wet processing or oxygen ashing.

In the semiconductor device 200 according to this variation, the surface of the joining metal layer 40 is exposed at the chip edge. Thereby, for example, adhesion between the chip and a resin when resin sealing the chip can be improved, and the formation of defects such as voids in the chip edge can be prevented.

In the example illustrated in FIG. 7B, the p-type contact layer 24a is left on a portion of the peripheral portion 60, but this embodiment is not limited thereto. For example, substantially all of the p-type contact layer 24a may be etched and removed from the peripheral portion 60. Moreover, cases where the p-type contact layer 24a is over-etched or where the p-type contact layer 24a is etched and removed up to a portion of the device portion 50 are included within the range of this embodiment.

In the embodiment described above, examples of semiconductor light emitting devices were given for the purpose of explanation, but it is possible to apply this embodiment to, for example, electronic devices such as Field Effect Transistors (FET) formed using GaN nitride semiconductors.

Note that, in this specification, "nitride semiconductor" includes $B_xIn_yAl_zGa_{(1-x-y-z)}N$ (where $0 \leq x \leq 1$, $0 \leq y \leq 1$, $0 \leq z \leq 1$, and $0 \leq x+y+z \leq 1$) group III-V compound semiconductors, and furthermore includes mixed crystals containing phosphorus (P) and/or arsenic (As) in addition to nitrogen (N) as group V elements.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the invention.

What is claimed is:
1. A semiconductor device comprising:
a substrate; and
a stacked body on the substrate via a joining metal layer comprising:
   a device portion including from a bottommost layer to a topmost layer included in the stacked body, and
   a peripheral portion surrounding and provided around the device portion, the peripheral portion being a portion of the bottommost layer to the topmost layer included in the stacked body and including a portion of a semiconductor layer in contact with the joining metal layer, the semiconductor layer being one selected from $In_x(Ga_yAl_{1-y})_{1-x}P$ ($0 \leq x \leq 1$ and $0 \leq y \leq 1$), $B_xIn_yGa_zAl_{1-x-y-z}N$ ($0 \leq x \leq 1$, $0 \leq y \leq 1$, $0 \leq z \leq 1$, and $x+y+z \leq 1$) and GaAlAs.

2. The device according to claim 1, wherein the stacked body in the device portion includes a light emitting layer, and the joining metal layer includes a metal that reflects light emitted from the light emitting layer.

3. The device according to claim 1, wherein the joining metal layer includes gold (Au).

4. The device according to claim 1, wherein the stacked body includes InGaAlP semiconductor.

5. The device according to claim 4, wherein the stacked body includes, from the topmost layer, a current diffusion layer, an n-type clad layer, the light emitting layer, a p-type clad layer, and a p-type contact layer.

6. The device according to claim 5, wherein the semiconductor layer in contact with the joining metal layer is the p-type contact layer.

7. The device according to claim 6, wherein the peripheral portion includes the p-type contact layer.

8. The device according to claim 6, wherein the peripheral portion includes the p-type contact layer and the p-type clad layer.

9. The device according to claim 1, wherein the stacked body includes a nitride semiconductor.

10. The device according to claim 1, wherein the joining metal layer is exposed at an edge of the peripheral portion.

11. The device according to claim 1, wherein the substrate is conductive.

12. The device according to claim 1, wherein the substrate is a silicon wafer.

13. The device according to claim 1, wherein the substrate is in contact with the joining metal layer.

* * * * *